United States Patent
Gonzalez

(10) Patent No.: US 7,123,039 B2
(45) Date of Patent: Oct. 17, 2006

(54) TESTING INPUT/OUTPUT VOLTAGES IN INTEGRATED CIRCUITS

(76) Inventor: Jason Gonzalez, 2909 Stonehaven Dr., Fort Collins, CO (US) 80525

( * ) Notice: Subject to any disclaimer, the term of this patent is extended or adjusted under 35 U.S.C. 154(b) by 3 days.

(21) Appl. No.: 10/917,766

(22) Filed: Aug. 13, 2004

(65) Prior Publication Data
US 2006/0033505 A1 Feb. 16, 2006

(51) Int. Cl.
G01R 31/26 (2006.01)
G01R 31/02 (2006.01)
G01R 31/3187 (2006.01)
(52) U.S. Cl. ............. 324/763; 324/765; 324/537
(58) Field of Classification Search ........... 324/765, 324/763, 606, 522; 327/68
See application file for complete search history.

(56) References Cited

U.S. PATENT DOCUMENTS

| | | | | |
|---|---|---|---|---|
| 6,133,772 | A * | 10/2000 | Drapkin et al. | 327/206 |
| 6,720,800 | B1 * | 4/2004 | Shyr et al. | 327/103 |
| 6,798,254 | B1 * | 9/2004 | Marshall et al. | 327/68 |
| 6,876,218 | B1 * | 4/2005 | Simmons et al. | 324/763 |
| 6,946,846 | B1 * | 9/2005 | Corr | 324/537 |
| 2001/0015653 | A1 * | 8/2001 | De Jong et al. | 324/763 |
| 2004/0027170 | A1 * | 2/2004 | Swanson et al. | 327/68 |

FOREIGN PATENT DOCUMENTS

EP    0 436 358 A3    7/1991
WO    WO 01/63310 A1    8/2001

* cited by examiner

*Primary Examiner*—Anjan Deb

(57) ABSTRACT

An integrated circuit (IC) measures a voltage at an interface of the IC. The IC comprises voltage reference, comparator, and control circuits. The voltage reference circuit provides reference voltages responsive to a control input. The comparator circuit compares a first reference voltage with a voltage at the interface. The control circuit receives an output of the comparator and adjusts the control input to provide a second reference voltage closer to the voltage at the interface. A method for measuring voltage at an IC interface comprises generating a first reference voltage, monitoring the voltage at the interface from within the IC, comparing the first reference and interface voltages, generating a second reference voltage responsive to a result of the comparing, replacing the first reference voltage with the second reference voltage, and repeating until an applied reference voltage is substantially equal to the voltage at the interface.

28 Claims, 14 Drawing Sheets

US 7,123,039 B2

TESTING INPUT/OUTPUT VOLTAGES IN INTEGRATED CIRCUITS

BACKGROUND

Currently, integrated circuits (ICs) are incapable of measuring voltages of their input and/or output (I/O) signals. Determining such I/O voltages requires expensive and highly specialized equipment and can be time consuming. Therefore, there is a need for improved systems and methods, which address these and/or other shortcomings of the prior art.

SUMMARY

IC based systems and methods for testing integrated circuits are provided. In this regard, an embodiment of a method for measuring voltage at an interface of an IC comprises generating a reference voltage within an IC responsive to a control signal, monitoring a voltage at an interface of the IC from within the IC, comparing the reference voltage to the voltage at the interface, when the reference voltage is greater than the voltage at the interface, decreasing the reference voltage, and repeating the monitoring, comparing, and decreasing until the reference voltage is no longer greater than the voltage at the interface.

An embodiment of an alternative method for measuring voltage at an interface of an IC comprises generating a reference voltage within an IC responsive to a control signal, monitoring a voltage at an interface of the IC from within the IC, comparing the reference voltage to the voltage at the interface, when the reference voltage is less than the voltage at the interface, increasing the reference voltage, and repeating the monitoring, comparing, and increasing until the reference voltage is no longer less than the voltage at the interface.

An embodiment of an IC based system configured to measure voltage at an interface of the IC comprises a voltage reference, comparator, and control circuits. The voltage reference circuit provides different reference voltages responsive to a control input. The comparator circuit compares a first voltage to a voltage at the interface of the IC. The control circuit receives an output of the comparator and responsively adjusts the control input such that the voltage reference circuit provides a second voltage different from the first voltage and closer to the voltage at the interface.

Other features and/or advantages will be or may become apparent to one with skill in the art upon examination of the following drawings and detailed description. It is intended that all such features and/or advantages be included herein within the scope of the disclosure as defined in the appended claims.

BRIEF DESCRIPTION OF THE DRAWINGS

The drawings are not necessarily to scale, emphasis instead being placed on clearly illustrating the principles of the present invention.

DETAILED DESCRIPTION

According to one embodiment, an IC includes components for enabling the IC to measure voltages of signals that traverse an interface of the IC (i.e., input and/or output (I/O) signals). By measuring such I/O voltages, an IC facilitates several tests including, for example, tests directed to determining signal integrity, glitch levels, values of AC coupling capacitors, off-chip terminations, weak pull-ups, weak pull-downs, and impedance values.

The IC receives a control signal indicative of a desired reference voltage. The IC generates the reference voltage in accordance with the control signal and compares the reference voltage with a voltage at an interface of the IC. When the reference voltage is greater than the voltage at the interface, the IC generates a lower reference voltage and compares the new reference level with the voltage at the interface in a repetitive fashion until the applied reference voltage is no longer greater than the voltage at the interface. When the reference voltage is less than the voltage at the interface, the IC generates a higher reference voltage and compares the new reference level with the voltage at the interface in a repetitive fashion until the applied reference voltage is no longer less than the voltage at the interface. In the illustrated embodiments, a latched comparator is used to compare the reference voltage with the voltage at the interface of the IC. The latched comparator is supplied a clock signal having a frequency that enables adequate sampling of the analog voltages to provide a real-time analysis of the voltage at the interface. The IC adjusts the reference level over time such that the reference level closely tracks the analog voltage at the interface.

In one embodiment, the control signal originates from within the IC, for example, from within a test access port (TAP) block. Alternatively, the control signal is generated by an external test controller. Whether the control signal is generated within the IC or is received from an external test controller, test control logic operates the voltage reference, comparator, and control circuits to enable the aforementioned multiple test modes.

As described below, the control signal comprises a multi-bit digital signal. The IC converts the digital input signal into a corresponding analog voltage. The desired reference voltage can also be communicated to the IC via an analog control signal.

Figure 1A:
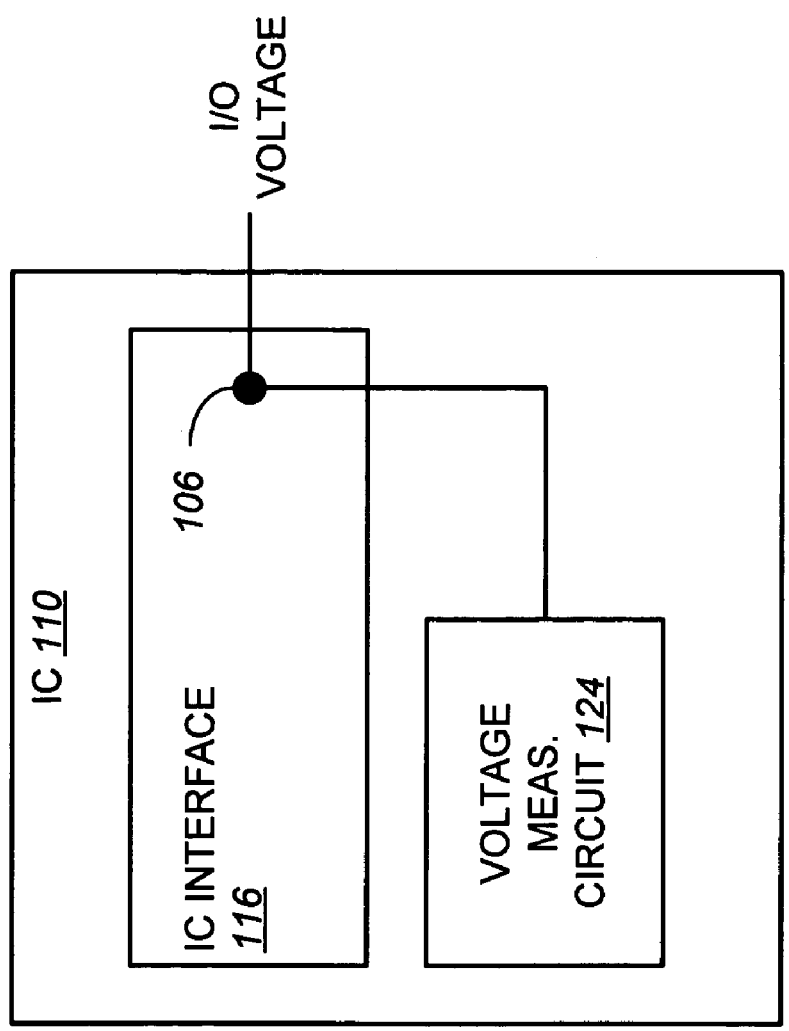
FIGS. 1A and 1B depict respective embodiments of an IC that is configured to measure its own input and/or output (I/O) voltage.
Figure 1B:
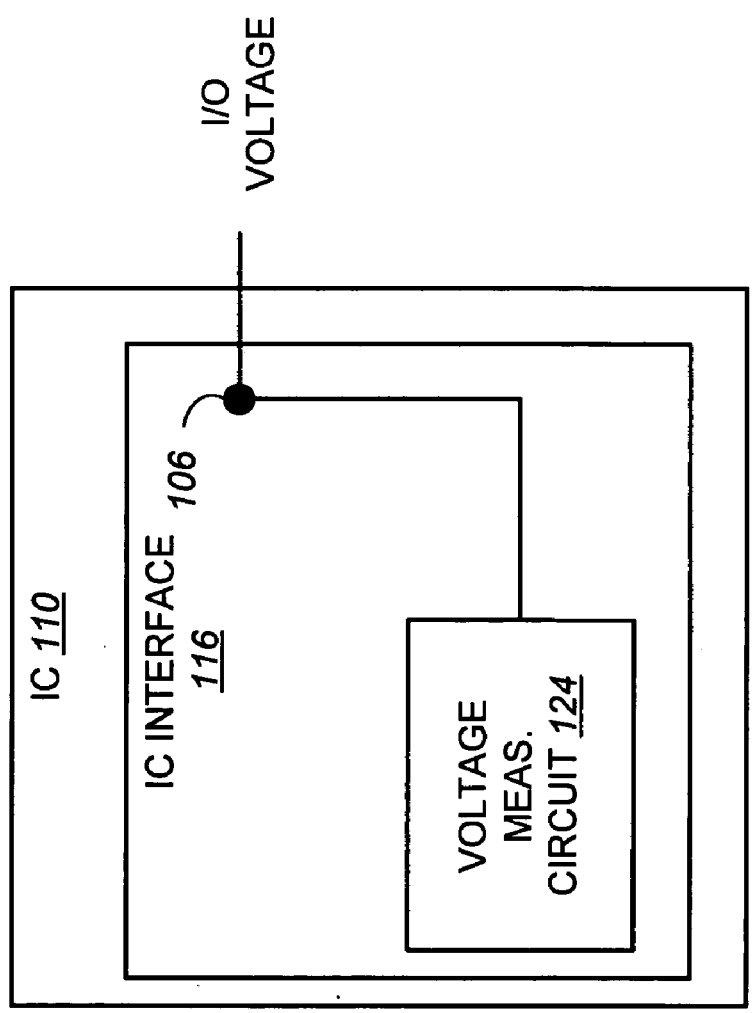

Reference will now be made in detail to the description of the invention as illustrated in the drawings, with like numerals indicating like parts throughout the several views. FIGS. 1A and 1B depict respective embodiments of an IC 110 configured to measure its own input and/or output (I/O) voltage. The IC 110 includes a voltage measurement circuit 124 and an IC interface 116. The IC interface 116 may include a contact site 106 that is coupled to an external device and one or more transmitters or receivers, as explained below. The voltage measurement circuit 124 is configured to measure an input or output (I/O) voltage for the IC 110 at the contact site 106. The voltage measurement circuit 124 may be located outside the IC interface 116, as shown in FIG. 1A, or within the IC interface 116, as shown in FIG. 1B.

Figure 1C:
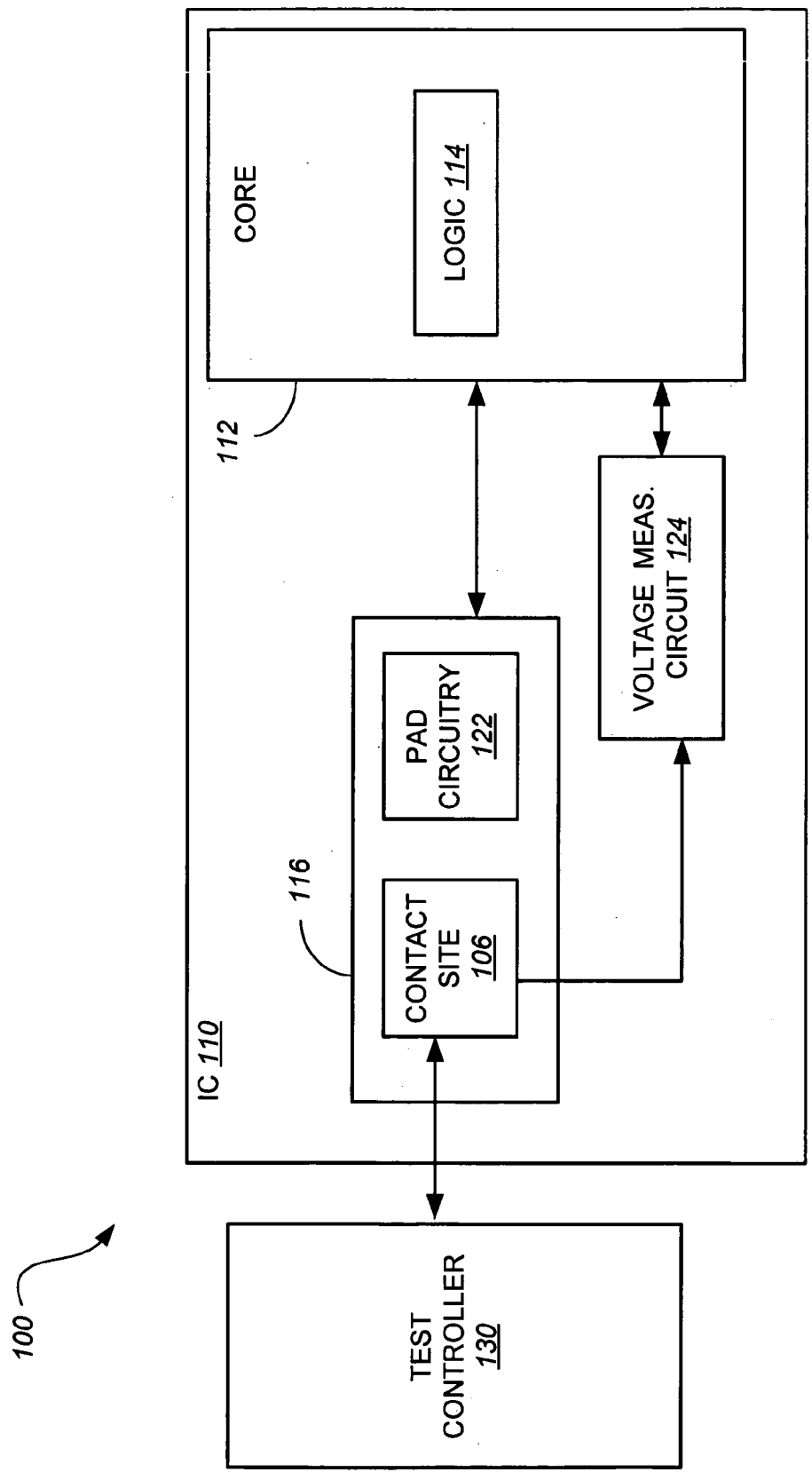
FIG. 1C depicts an embodiment of a voltage measurement system that includes an IC, such as the IC shown in FIG. 1A or 1B.

As shown in FIG. 1C, an embodiment of a voltage measurement system 100 includes an IC 110 having a core 112 that is coupled to an IC interface 116. The IC interface 116 enables intercommunication of the core's logic 114 with one or more devices external to the IC 110. The IC interface 116 includes a contact site 106, which serves as an electrical contact for the IC 110, as well as pad circuitry 122. The pad circuitry 122 may include one or more receivers (for receiving signals provided to the IC interface 116) and/or one or more drivers (for providing signals to external devices). Additionally, integrated circuit 110 incorporates voltage measurement circuit 124 that is coupled to the IC interface 116 and contact site 106. In the illustrated embodiment, IC 110 is coupled to a test controller 130 that is configured to initiate and control I/O voltage measurement tests.

Figure 2A:
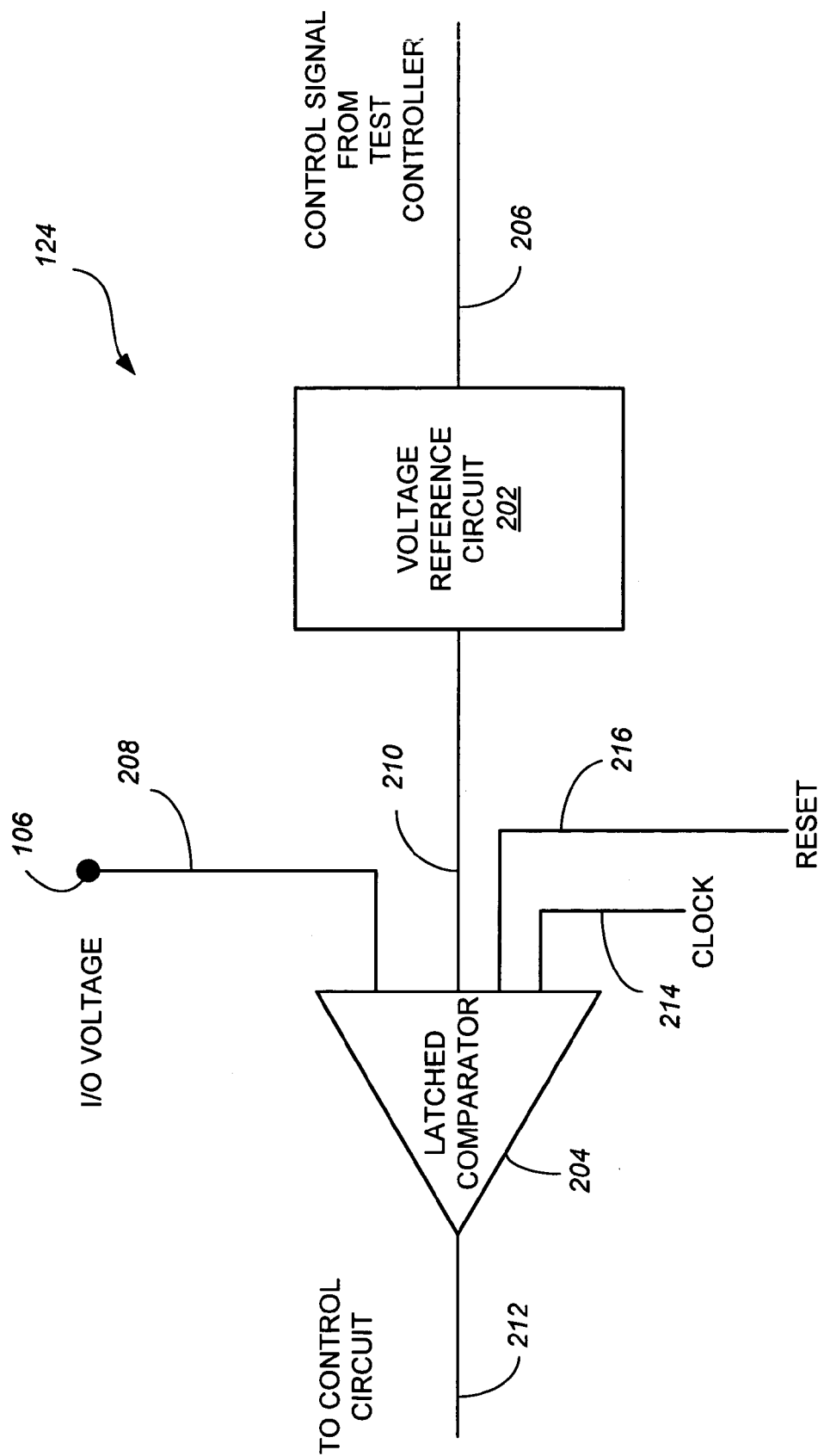
FIG. 2A is a block diagram illustrating an embodiment of a voltage measurement circuit, such as the voltage measurement circuit shown in FIG. 1A, 1B, or 1C.

FIG. 2A is a block diagram illustrating an embodiment of the voltage measurement circuit 124. In this example, the voltage measurement circuit includes a voltage reference circuit 202 and a latched comparator 204. The voltage reference circuit 202 receives a control signal 206 and outputs a voltage reference signal 210. The latched comparator 204 receives an I/O signal 208 and the voltage reference signal 210 and outputs a comparison result signal along conductor 212. The comparison result signal 212 indicates whether the I/O signal 208 is greater than the voltage reference signal 210. The clock signal 214 and the reset signal 216 control the latched comparator 204. Clock signal 214 directs the comparator when to compare the magnitudes of I/O signal 208 and voltage reference signal 210. Reset signal 216 temporarily removes I/O signal 208 and voltage reference signal 210 from latched comparator 204.

In one embodiment, the voltage reference circuit 202 outputs a series of different voltage reference signals 210. By comparing the I/O signal 208 with the series of different voltage reference signals 210, the voltage measurement circuit 124 can help determine the magnitude of the voltage at the contact site 106. Preferably, control signal 206 is a digital signal responsive to variation due to temperature, supply voltage, and the IC manufacturing process used to produce the IC.

TABLE 1

Example of determining an I/O Voltage of an IC

| I/O Voltage 208 | Reference Voltage 210 | Comparator Output 212 |
|---|---|---|
| z | x + y | 0 |
| z | x + 2y | 0 |
| z | x + 3y | 0 |
| z | x + 4y | 0 |
| z | x + 5y | 0 |
| z | x + 6y | 0 |
| z | x + 7y | 0 |
| z | x + 8y | 0 |
| z | x + 9y | 0 |
| z | x + 10y | 1 |

In the example illustrated in Table 1, the I/O voltage is equal to z, where z is equal to x+10y, and where x, y, and z are positive numbers. The reference voltage is initially set to be equal to x+y, where x+y is less than z. The reference voltage is gradually increased in a step-wise manner by integer multiples of y until the reference voltage is equal to x+10y. When this occurs, the comparator output changes from logic 0 to logic 1, indicating that the voltage at the I/O interface lies somewhere between the last two reference voltage values. The voltage measurement circuit 124 may also be configured such that the comparator output is logic 1 responsive to reference voltage being less than the I/O voltage, and logic 0 responsive to the reference voltage being greater than or equal to the I/O voltage, as shown in Table 2.

TABLE 2

Example of determining an I/O Voltage of an IC

| I/O Voltage 208 | Reference Voltage 210 | Comparator Output 212 |
|---|---|---|
| z | x + y | 1 |
| z | x + 2y | 1 |
| z | x + 3y | 1 |
| z | x + 4y | 1 |
| z | x + 5y | 1 |
| z | x + 6y | 1 |
| z | x + 7y | 1 |
| z | x + 8y | 1 |
| z | x + 9y | 1 |
| z | x + 10y | 0 |

The reference voltage may also be configured to decrease in order to determine the value of the I/O voltage, as shown in table 3.

TABLE 3

Example of determining an I/O Voltage of an IC

| I/O Voltage 208 | Reference Voltage 210 | Comparator Output 212 |
|---|---|---|
| w | x + 10y | 0 |
| w | x + 9y | 0 |
| w | x + 8y | 0 |
| w | x + 7y | 0 |
| w | x + 6y | 0 |
| w | x + 5y | 0 |
| w | x + 4y | 0 |
| w | x + 3y | 0 |

TABLE 3-continued

Example of determining an I/O Voltage of an IC

| I/O Voltage 208 | Reference Voltage 210 | Comparator Output 212 |
|---|---|---|
| w | x + 2y | 0 |
| w | x + y | 1 |

In the example illustrated in Table 3, the I/O voltage is equal to w, where w is equal to x+y, and where x, y, and z are positive numbers. The reference voltage is initially set to be equal to x+10 y, where x+10y is greater than z. The reference voltage is gradually decreased in a step-wise manner with a constant step of an integer multiple of y until the reference voltage is less than or equal to x+y. When this occurs, the comparator output changes from logic 0 to logic 1 indicating that the output at the I/O interface is somewhere between the last two values of Table 3. The voltage measurement circuit 124 may also be configured such that the comparator output is logic 1 responsive to reference voltage being greater than the I/O voltage, and logic 0 responsive to the reference voltage being less than or equal to the I/O voltage, as shown in Table 4.

TABLE 4

Example of determining an I/O Voltage of an IC

| I/O Voltage 208 | Reference Voltage 210 | Comparator Output 212 |
|---|---|---|
| w | x + 10y | 1 |
| w | x + 9y | 1 |
| w | x + 8y | 1 |
| w | x + 7y | 1 |
| w | x + 6y | 1 |
| w | x + 5y | 1 |
| w | x + 4y | 1 |
| w | x + 3y | 1 |
| w | x + 2y | 1 |
| w | x + y | 0 |

In another embodiment, the reference voltage may be adjusted in varying amounts, as shown in Table 5.

TABLE 5

Example of determining an I/O Voltage of an IC

| I/O Voltage 208 | Reference Voltage 210 | Comparator Output 212 |
|---|---|---|
| 0.99 * VDD | 0.5 * VDD | 0 |
| 0.99 * VDD | 0.75 * VDD | 0 |
| 0.99 * VDD | 0.875 * VDD | 0 |
| 0.99 * VDD | 0.938 * VDD | 0 |
| 0.99 * VDD | 0.969 * VDD | 0 |
| 0.99 * VDD | 0.984 * VDD | 0 |
| 0.99 * VDD | 0.992 * VDD | 1 |

In the example shown in Table 5, the I/O voltage is equal to 0.99*VDD. The reference voltage is initially set to be equal to 0.5*VDD, but is gradually increased in a step-wise manner by an amount equal to [(VDD−current reference voltage)/2] until the reference voltage is greater than or equal to the I/O voltage. At that point, the comparator output changes from logic 0 to logic 1. The voltage measurement circuit 124 may also be configured such that the comparator output is logic 1 responsive to reference voltage being less than the I/O voltage, and logic 0 responsive to the reference voltage being greater than or equal to the I/O voltage, as shown in Table 6.

TABLE 6

Example of determining an I/O Voltage of an IC

| I/O Voltage 208 | Reference Voltage 210 | Comparator Output 212 |
|---|---|---|
| 0.99 * VDD | 0.5 * VDD | 1 |
| 0.99 * VDD | 0.75 * VDD | 1 |
| 0.99 * VDD | 0.875 * VDD | 1 |
| 0.99 * VDD | 0.938 * VDD | 1 |
| 0.99 * VDD | 0.969 * VDD | 1 |
| 0.99 * VDD | 0.984 * VDD | 1 |
| 0.99 * VDD | 0.992 * VDD | 0 |

The reference voltage may also be configured to decrease by varying amounts in order to determine the value of the I/O voltage, as shown in Table 7.

TABLE 7

Example of determining an I/O Voltage of an IC

| I/O Voltage 208 | Reference Voltage 210 | Comparator Output 212 |
|---|---|---|
| 0.01 * VDD | 0.5 * VDD | 0 |
| 0.01 * VDD | 0.25 * VDD | 0 |
| 0.01 * VDD | 0.125 * VDD | 0 |
| 0.01 * VDD | 0.063 * VDD | 0 |
| 0.01 * VDD | 0.031 * VDD | 0 |
| 0.01 * VDD | 0.016 * VDD | 0 |
| 0.01 * VDD | 0.008 * VDD | 1 |

In the example shown in Table 7, the I/O voltage is equal to 0.01*VDD. The reference voltage is initially set to be equal to 0.5*VDD, but is gradually decreased in a step-wise manner by an amount equal to [current reference voltage/2] until the reference voltage is less than or equal to the I/O voltage. At that point, the comparator output changes from logic 0 to logic 1. The voltage measurement circuit 124 may also be configured such that the comparator output is logic 1 responsive to reference voltage being greater than the I/O voltage, and logic 0 responsive to the reference voltage being less than or equal to the I/O voltage, as shown in Table 8.

TABLE 8

Example of determining an I/O Voltage of an IC

| I/O Voltage 208 | Reference Voltage 210 | Comparator Output 212 |
|---|---|---|
| 0.01 * VDD | 0.5 * VDD | 1 |
| 0.01 * VDD | 0.25 * VDD | 1 |
| 0.01 * VDD | 0.125 * VDD | 1 |
| 0.01 * VDD | 0.063 * VDD | 1 |
| 0.01 * VDD | 0.031 * VDD | 1 |
| 0.01 * VDD | 0.016 * VDD | 1 |
| 0.01 * VDD | 0.008 * VDD | 0 |

Figure 2B:
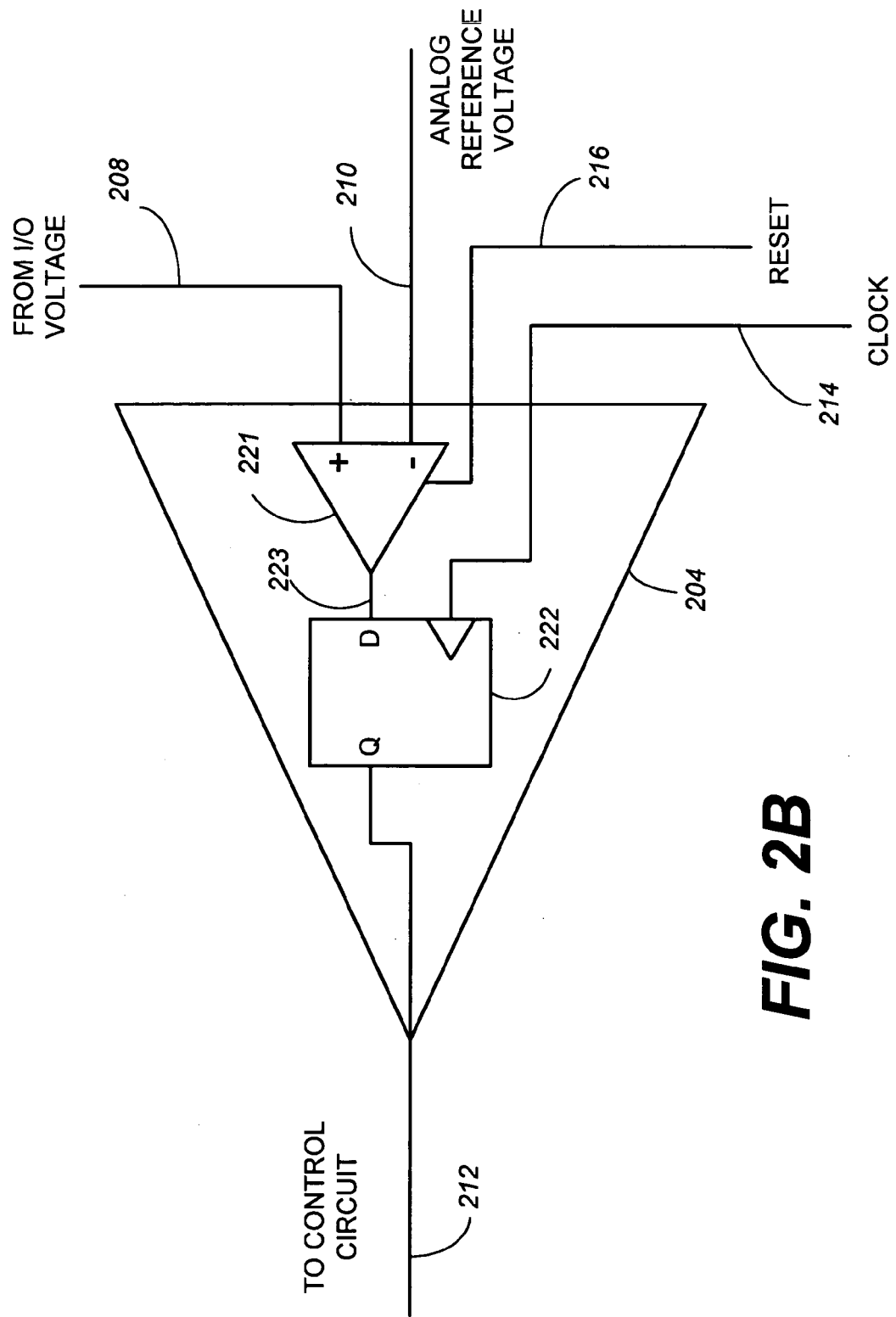
FIG. 2B is a circuit diagram depicting an embodiment of a latched comparator, such as the latched comparator shown in FIG. 2A.

FIG. 2B is a circuit diagram depicting an embodiment of the latched comparator 204 shown in FIG. 2A. The latched comparator 204 includes a receiver 221 and a latch 222. The receiver 221 receives an I/O signal 208 and a voltage reference signal 210 as inputs, and outputs a receiver output signal 223 to the latch 222. If the I/O signal 208 is greater than the voltage reference signal 210 then the receiver output signal 223 has a voltage corresponding to logic 1. Conversely, if the voltage reference signal 210 is greater than the I/O signal 208, then the receiver output signal 223 has a voltage corresponding to logic 0. The value of the receiver output signal 223 is captured by the D gate (of the latch 222) and output by the Q gate (as the comparator result signal 212) when the clock signal 214 transitions from low to high. A reset signal 216 is asserted before each comparison of the I/O signal 208 and the voltage reference signal 210.

Figure 3:
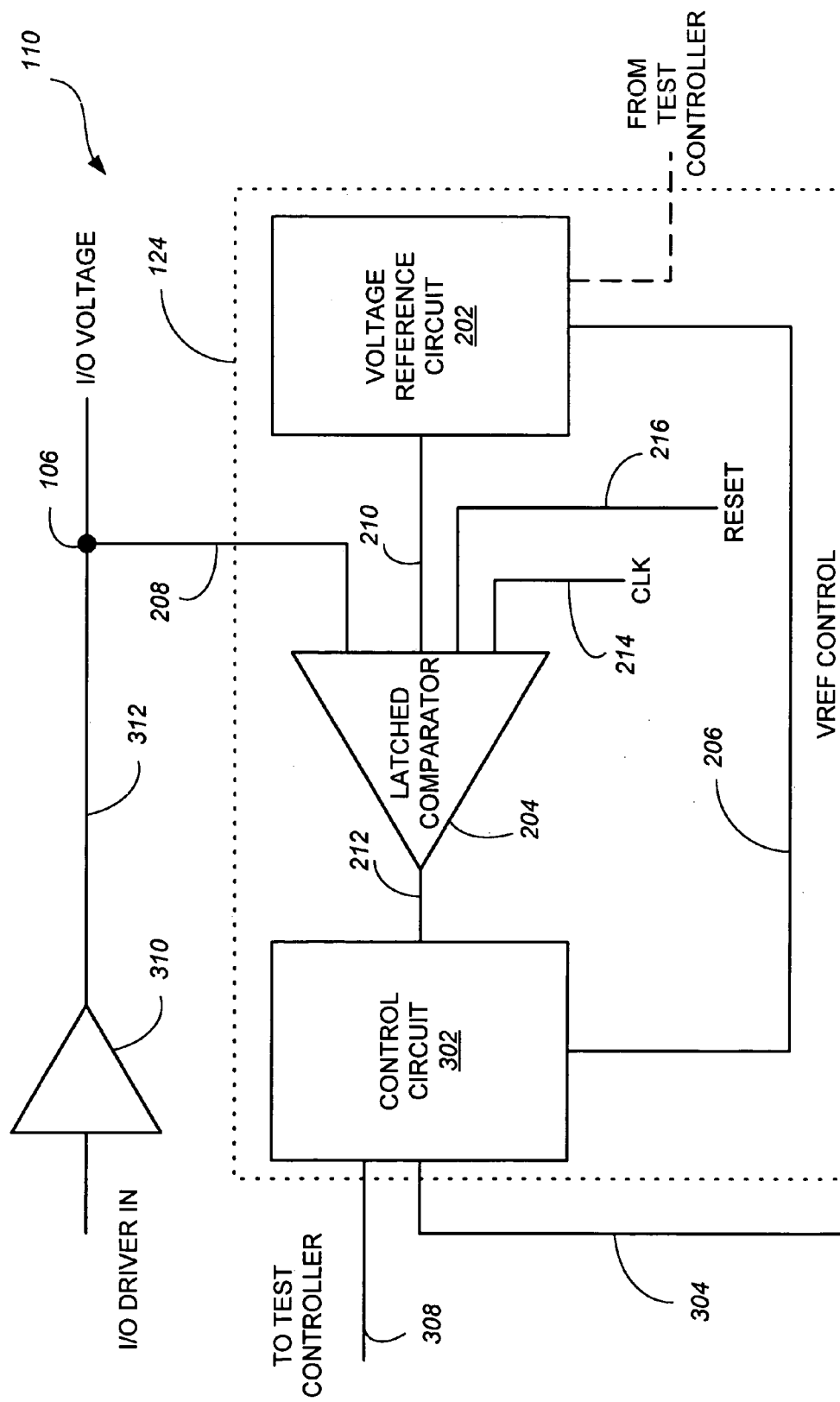
FIG. 3 depicts an example embodiment of selected components of an IC, such as the IC shown in FIG. 1A, 1B, or 1C.

FIG. 3 depicts an example arrangement of select components of the IC 110. In this example, the IC 110 includes a voltage measurement circuit 124 and a driver 310. The voltage measurement circuit 124 is configured to measure an input or output (I/O) voltage for the IC 110 at the contact site 106.

The voltage measurement circuit 124 includes the voltage reference circuit 202, the latched comparator 204, and the control circuit 302. The latched comparator 204 receives the I/O signal 208 and the voltage reference signal 210 and outputs the comparison result signal 212. The control circuit 302 receives the comparison result signal 212 and outputs the control input 206. The control input 206 causes the voltage reference circuit 202 to change the value of the voltage reference signal 210. As shown in FIG. 3, the control input 206 originates within control circuit 302 under the direction of a test controller. In an alternative arrangement, control input 206 can be forwarded directly from the test controller as indicated by the dashed line.

In one embodiment, the control circuit 302 uses the control signal 206 to direct the voltage reference circuit 202 to output a series of the voltage reference signal 210 having different values. The latched comparator 204 compares the series of the voltage reference signal 210 to the I/O signal 208 at different points in time, as regulated by the clock signal 214.

The latched comparator 204 outputs the comparison result signal 212, which indicates whether of the I/O signal 208 or the voltage reference signal 210 has a greater value. The value of the voltage reference signal 210 corresponding to a change in the comparison result signal 212 is approximately equal to the value of the I/O signal 208.

In one embodiment, the value of the I/O signal 208 is determined by an average of two or more voltage reference signal 210 values captured at separate times. For example, the value of the voltage reference signal 210 just before the comparison result signal 212 changes values and the value of the voltage reference signal 210 at the time that the comparison result signal 212 changes values. In an alternative embodiment, the value of the I/O signal 208 is determined by the value of the voltage reference signal 210 just after the transition of the comparison result signal 212. In still another embodiment, the value of the I/O signal 208 is determined by the value of the voltage reference signal 210 just before the transition of the comparison result signal 212.

The control circuit 302 may be programmed by a control parameters signal 304 that may be received from the IC core 112 (FIG. 1C) or from the test controller 130 (FIG. 1C). The control circuit 302 provides an output signal 308 to the IC core 112 and/or to the test controller 130 (FIG. 1C). The output signal 308 is a measurement result corresponding to the I/O voltage at contact site 106.

In one embodiment, the test controller 130 (FIG. 1) directs the driver 310 to output an output signal 312 by providing an I/O driver input. To determine whether the IC 110 is functioning properly, the voltage measurement circuit 124 measures an output voltage corresponding to the output signal 312.

Figure 4:
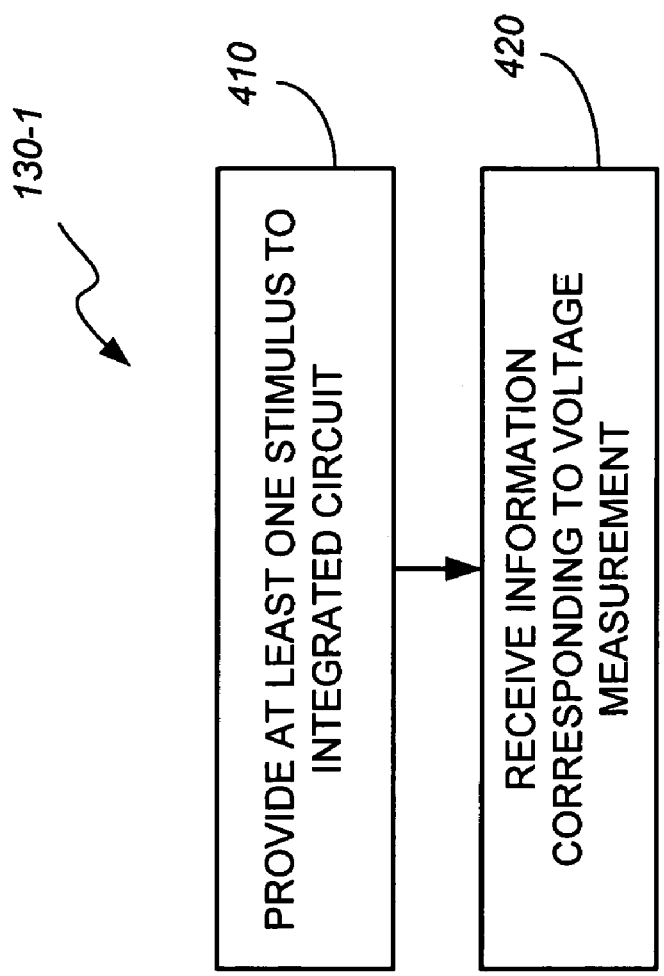
FIG. 4 depicts an embodiment of a method for testing an IC, such as the IC shown in FIG. 1A, 1B, or 1C.

Reference will now be made to the flow chart of FIG. 4, which depicts an embodiment of a method 130-1 for testing an IC 110 (FIGS. 1A–1C). The method 130-1 may be implemented by, for example, the test controller 130 (FIG. 1C). As shown in FIG. 4, the method 130-1 may be construed as beginning at block 410, where at least one stimulus is provided to the IC 110. In block 420, information from the IC 110 corresponding to an I/O voltage of the IC 110 is received by the test controller 130.

Figure 5:
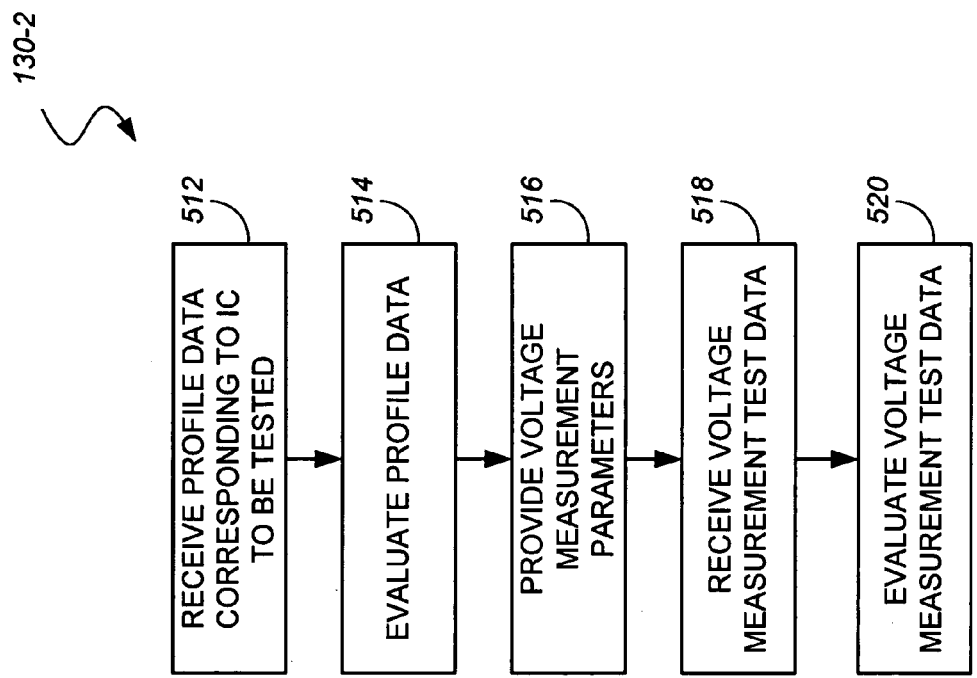
FIG. 5 is a flow chart depicting another embodiment of a method for testing an IC, such as the IC shown in FIG. 1A, 1B, or 1C.

FIG. 5 is a flow chart depicting an embodiment of a method 130-2 for testing an IC 110 (FIGS. 1A–1C). The method 130-2 may be implemented by, for example, the test controller 130. As shown in block 512, profile data corresponding to the IC 110 to be tested is received. Such profile data may include, but is not limited to, information relating to the type of IC and/or electrical continuity information corresponding to the interconnection of the test controller 130 and the IC 110, among others. The profile data may be provided in numerous manners, such as by being provided in the form of an operator input at a work station or as a response to a test initiation signal delivered to test circuitry by the test controller 130, for instance. After receiving the profile data, if applicable, method 130-2 proceeds to block 514 where the data is evaluated, i.e., a determination is made as to whether testing may proceed.

At block 516, the IC under test is provided with appropriate signals (e.g., by the test controller 130) to facilitate I/O voltage measurement. At block 518, test data is received, such as by the test controller 130, with the data being received in any suitable manner, (e.g., intermittently throughout the testing cycle, or after testing has been completed). At block 520, the I/O voltage data is evaluated and a determination may be made as to whether the IC 110 is functioning as desired.

Figure 6A:
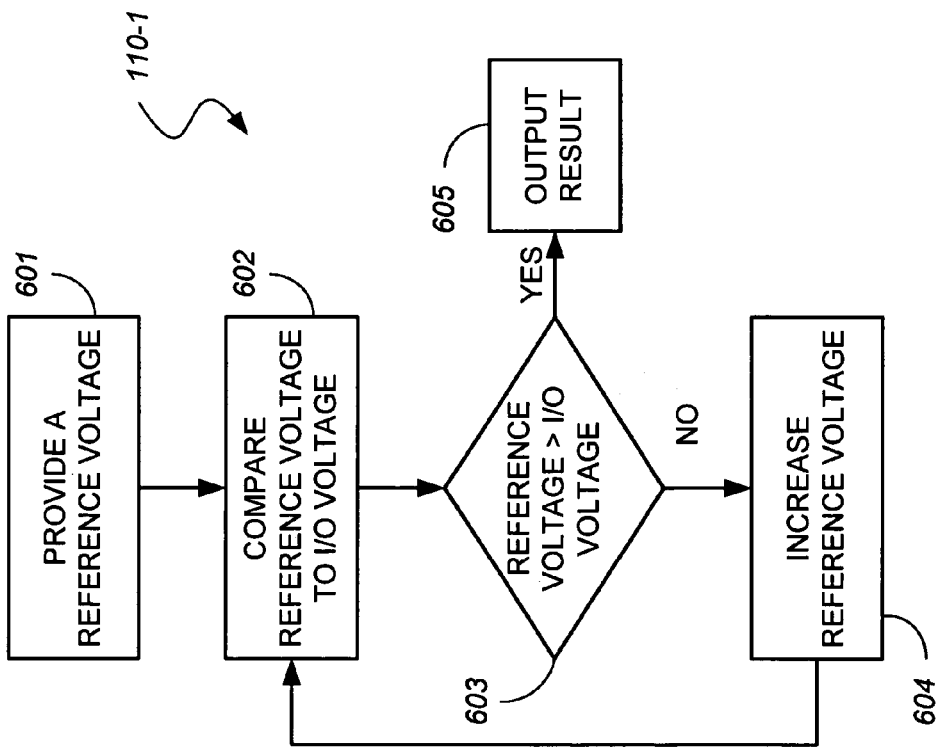
FIG. 6A is a flow chart depicting an embodiment of a method that is implemented by an IC, such as the IC shown in FIG. 1A, 1B, or 1C.

FIG. 6A is a flow chart depicting a method 110-1 that is implemented by the IC 110 (FIGS. 1A–1C). As indicated in block 601, IC 110 provides a reference voltage. The reference voltage may be provided by, for example, the voltage reference circuit 202 (FIG. 2). The reference voltage is compared to an I/O voltage of the IC 110, as indicated in block 602. The I/O voltage may be, for example, a voltage at contact site 106 (FIG. 1A). A determination is then made as to whether the reference voltage is greater than the I/O voltage, as indicated in block 603. The determination may be made by a control circuit 302 (FIG. 3), which may be, for example, the TAP (test access port). If the reference voltage is not greater than the I/O voltage, then the reference voltage is increased, as indicated in block 603, and the method 110-1 returns to step 602 where the new reference voltage is compared to the I/O voltage. If the reference voltage is greater than the I/O voltage, then the IC 110, as indicated in block 605, outputs a result corresponding to the value of the I/O voltage.

Figure 6B:
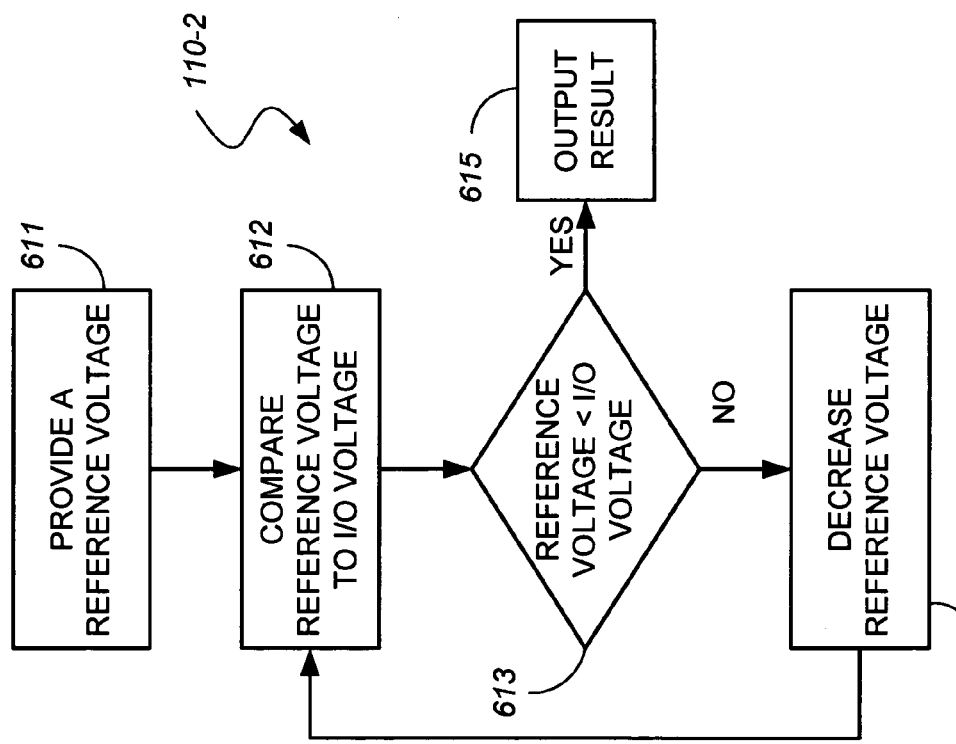
FIG. 6B is a flow chart depicting another embodiment of a method that is implemented by an IC, such as the IC shown in FIG. 1A, 1B, or 1C.

FIG. 6B is a flow chart depicting another embodiment of a method 110-2 that is implemented by the IC 110 (FIGS. 1A–1C). As indicated in block 611, the IC 110 provides a reference voltage. The reference voltage may be provided by, for example, the voltage reference circuit 202 (FIG. 2A). The reference voltage is compared to an I/O voltage of the IC 110, as indicated in block 612. The I/O voltage may be, for example, a voltage at contact site 106 (FIG. 1A). A determination is then made as to whether the reference voltage is less than the I/O voltage, as indicated in block 613. A control circuit 302 (FIG. 3) may make the determination. If the reference voltage is not less than the I/O voltage, then the reference voltage is decreased, as indicated in block 614, and the method 110-1 returns to step 612 where the new reference voltage is compared to the I/O voltage. If the reference voltage is less than the I/O voltage, then the IC 110, as indicated in block 615, outputs a result corresponding to the value of the I/O voltage.

Figure 6C:
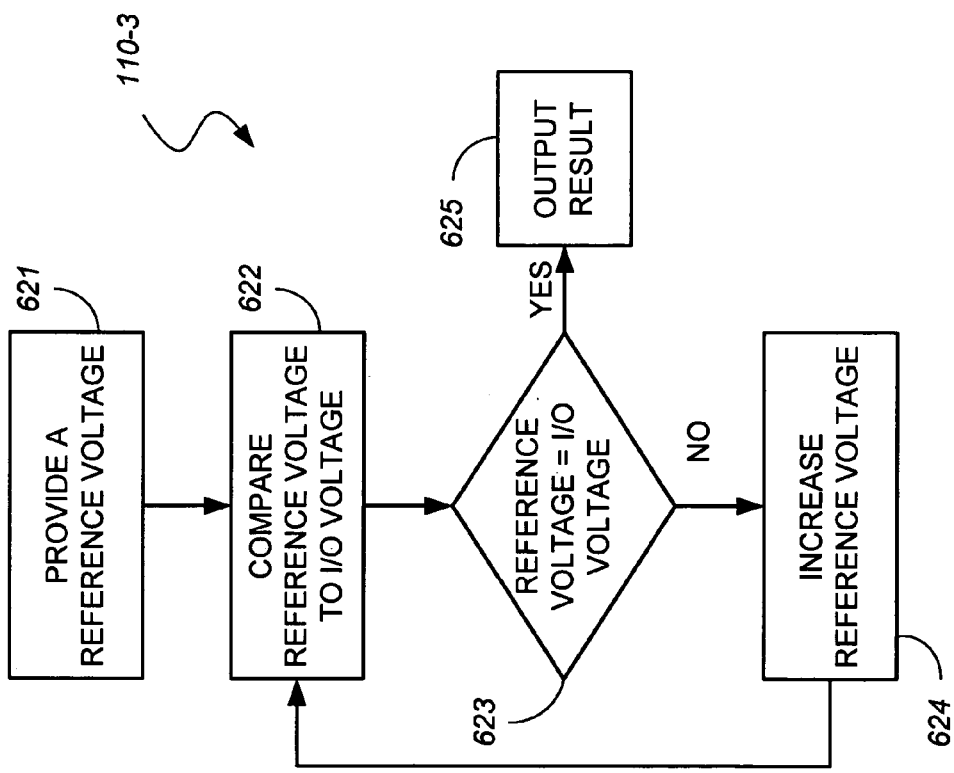
FIG. 6C is a flow chart depicting yet another embodiment of a method that is implemented by an IC, such as the IC shown in FIG. 1A, 1B, or 1C.

FIG. 6C is a flow chart depicting an embodiment of a method 110-3 that is implemented by the IC 110 (FIGS. 1A–1C). As indicated in block 621, the IC 110 provides a reference voltage. The reference voltage may be provided by, for example, the voltage reference circuit 202 (FIG. 2). The reference voltage is compared to an I/O voltage of the IC 110, as indicated in block 622. The I/O voltage may be, for example, a voltage at contact site 106 (FIG. 1A). A determination is then made as to whether the reference voltage is equal to the I/O voltage, as indicated in block 623. The determination may be made by a control circuit 302 (FIG. 3), which may be, for example, the TAP. If the reference voltage is not equal to the I/O voltage, then the reference voltage is increased, as indicated in block 624, and the method 110-1 returns to step 622 where the new reference voltage is compared to the I/O voltage. If the reference voltage is equal to the I/O voltage, then the IC 110, as indicated in block 625, outputs a result corresponding to the value of the I/O voltage.

Figure 6D:
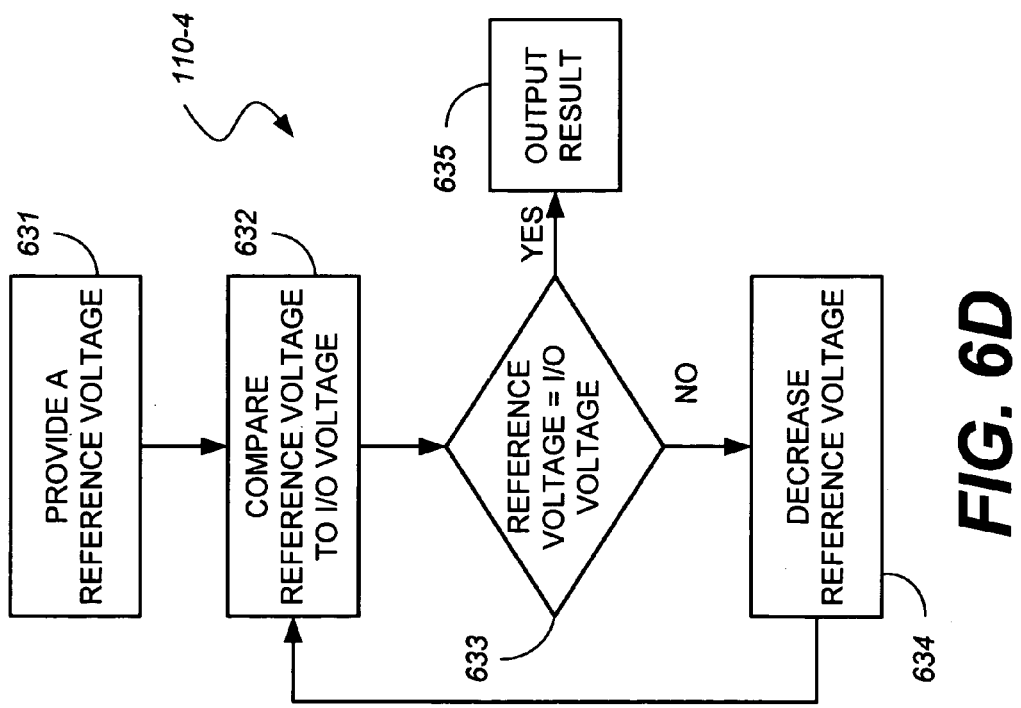
FIG. 6D is a flow chart depicting a further embodiment of a method that is implemented by an IC, such as the IC shown in FIG. 1A, 1B, or 1C.

FIG. 6D is a flow chart depicting another embodiment of a method 110-4 that may be implemented by the IC 110 (FIGS. 1A–1C). As indicated in block 631, the IC 110 provides a reference voltage. The reference voltage may be provided by, for example, the voltage reference circuit 202 (FIG. 2). The reference voltage is compared to an I/O voltage of the IC 110, as indicated in block 632. The I/O voltage may be, for example, a voltage at contact site 106 (FIG. 1A). A determination is then made as to whether the reference voltage is equal to the I/O voltage, as indicated in block 633. A control circuit 302 (FIG. 3) may make the determination. If the reference voltage is not equal to the I/O voltage, then the reference voltage is decreased, as indicated in block 634, and the method 110-1 returns to step 632 where the new reference voltage is compared to the I/O voltage. If the reference voltage is equal to the I/O voltage, then the IC 110, as indicated in block 635, outputs a result corresponding to the value of the I/O voltage.

It should be noted that in some alternative implementations the functions noted in the various blocks may occur out of the order depicted in FIGS. 4–6D. For example, two blocks shown in succession may, in fact, be executed substantially concurrently or in reverse order, depending upon the functionality involved.

Figure 7:
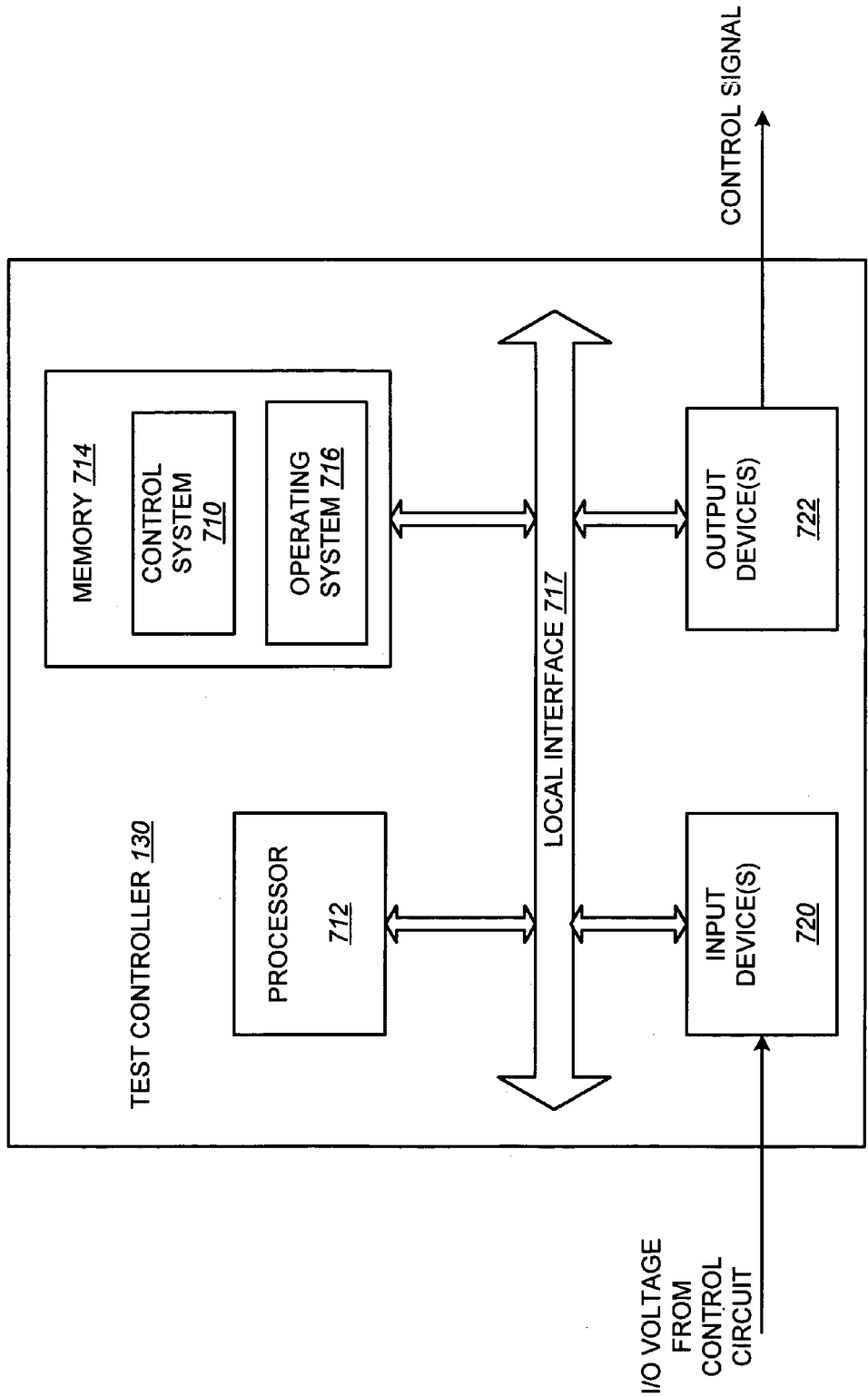
FIG. 7 illustrates an embodiment of a test controller, such as the test controller shown in FIG. 1C.

FIG. 7 illustrates an embodiment of a test controller 130 that may be configured to initiate and control the testing of the IC 110 (FIG. 1). As shown in FIG. 7, the test controller 130 generally comprises a processor 712 and a memory 714 with an operating system 716. Herein, the memory 714 may be any combination of volatile and nonvolatile memory elements, such as random access memory or read only memory. The processor 712 accepts instructions and data from memory 714 over a local interface 717, which may include one or more buses.

The test controller 130 also includes an input device(s) 720, which receives an I/O voltage from control circuit 302 (FIG. 3) and an output device(s) 722, which forwards control signal 206 to voltage measurement circuit 124 (FIG. 1). Example input devices include, but are not limited to a serial port, a scanner, or a local access network connection. Example output devices include, but are not limited to a video display, a Universal Serial Bus, or a printer port.

Figure 8:
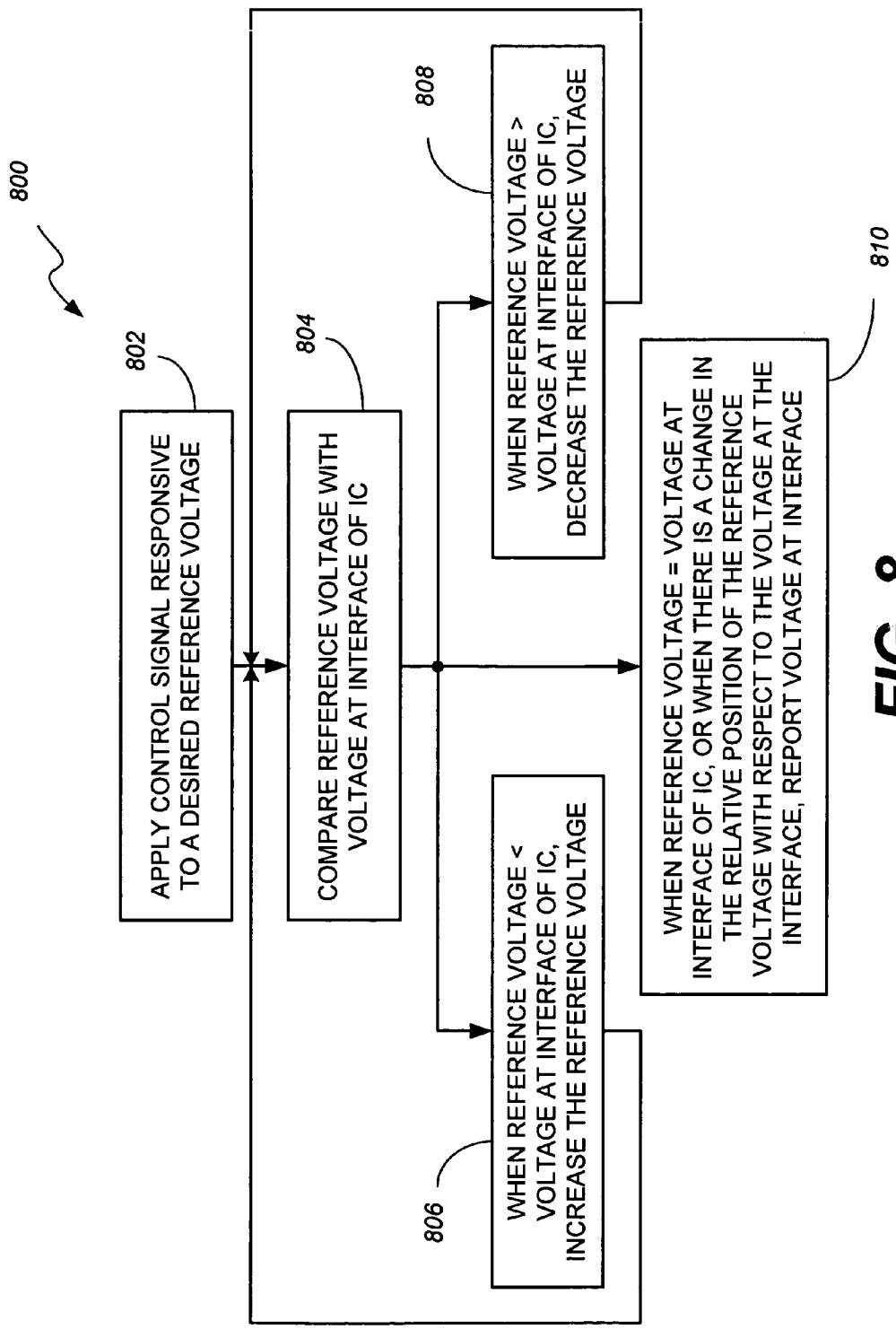
FIG. 8 is a flow chart, which illustrates an embodiment of a method for monitoring an I/O voltage of an IC.

Reference will now be made to the flow chart of FIG. 8, which illustrates an embodiment of a method 800 for monitoring an I/O voltage of an IC. Method 800 begins at block 802 where a control signal responsive to a desired reference voltage is applied to an IC. In block 804 the IC the reference voltage is compared with the voltage at the interface of interest. As indicated in block 806, when the reference voltage is less than the voltage at the interface, the IC responds by controllably increasing the reference voltage. After increasing the reference voltage, method 800 returns to block 804. As indicated in block 808, when the reference voltage is greater than the voltage at the interface, the IC responds by controllably decreasing the reference voltage. After decreasing the reference voltage, method 800 returns to block 804. As indicated in block 810 when the reference voltage is substantially equal to the voltage at the interface of the IC, or when the relative position of the reference voltage with respect to the voltage at the interface changes, the reference voltage level is reported or otherwise logged as the voltage at the interface of the IC. As described above, in a first embodiment the reported voltage at the interface of the IC is the last reference voltage applied in the comparison step. Alternatively, when it is the case that the relative position of the reference voltage to the voltage at the interface changes, the reported voltage can be a function of the last two applied reference voltages (e.g., an average of the last applied reference voltages). It should be further understood that if further accuracy in the reported voltage is desired, the IC may use smaller reference voltage adjustment steps in response to a change in the relative position of the reference voltage to the voltage at the interface. These smaller adjustment steps would be applied in reverse of the reference voltage change that resulted in the change of the relative position of the reference voltage with respect to the voltage at the interface.

The foregoing description has been presented for purposes of illustration and description. It is not intended to be exhaustive or to limit the scope of the claims to the precise forms disclosed. Modifications or variations are possible in light of the above teachings. The embodiments discussed, however, were chosen and described to enable one of ordinary skill in the art to utilize various embodiments. All such modifications and variations are within the scope of the appended claims when interpreted in accordance with the breadth to which they are fairly and legally entitled.

What is claimed is:

1. An integrated circuit (IC) enabled method for measuring voltage at an interface of the IC, comprising:
   generating a reference voltage within an IC responsive to a control signal;
   using an internal measurement circuit on the IC to monitor a voltage at an interface of the IC;
   comparing the reference voltage to the voltage at the interface within the IC, when the reference voltage is greater than the voltage at the interface within the IC;
   decreasing the reference voltage;
   repeating the monitoring, comparing, and decreasing until the reference voltage is no longer greater than the voltage at the interface.

2. The method of claim 1, wherein generating a reference voltage comprises receiving the control signal from a test controller.

3. The method of claim 1, wherein using a measurement circuit coupled to core logic of the IC to monitor a voltage at the interface of the IC comprises coupling a pad to a comparator input.

4. The method of claim 1, further comprising:
generating an output signal when the reference voltage is no longer greater than the voltage at the interface.

5. The method of claim 1, wherein decreasing the reference voltage comprises applying a function to the reference voltage.

6. The method of claim 5, wherein the function comprises a negative-step function.

7. The method of claim 6, wherein the negative-step function comprises a step having a constant magnitude between adjacent steps.

8. The method of claim 6, wherein the negative-step function comprises a step having a variable magnitude between adjacent steps.

9. The method of claim 5, wherein the function comprises a divisor that is a multiple of two.

10. An integrated circuit (IC) enabled method for measuring a voltage at an interface of the IC, comprising:
generating a reference voltage within an IC responsive to a control signal;
using an internal measurement circuit on the IC to monitor a voltage at an interface of the IC;
comparing the reference voltage to the voltage at the interface within the IC, when the reference voltage is less than the voltage at the interface;
increasing the reference voltage; and
repeating the monitoring, comparing, and increasing until the reference voltage is no longer less than the voltage at the interface.

11. The method of claim 10, wherein generating a reference voltage comprises receiving the control signal from a test controller.

12. The method of claim 10, wherein using a measurement circuit coupled to core logic of the IC to monitor a voltage at the interface of the IC comprises coupling a pad to a comparator input.

13. The method of claim 10, further comprising:
generating an output signal when the reference voltage is no longer less than the voltage at the interface.

14. The method of claim 10, wherein increasing the reference voltage comprises applying a function to the reference voltage.

15. The method of claim 14, wherein the function comprises a positive-step function.

16. The method of claim 15, wherein the positive-step function comprises a step having a constant magnitude between adjacent steps.

17. The method of claim 15, wherein the positive-step function comprises a step having a variable magnitude between adjacent steps.

18. The method of claim 14, wherein the function comprises a divisor that is a multiple of two.

19. An integrated circuit (IC) based system configured to measure a voltage at an interface of the IC, comprising:
a voltage reference circuit configured to provide a plurality of different reference voltages responsive to a control input;
a comparator circuit configured to compare a first reference voltage provided by the voltage reference circuit with a voltage at an interface of the IC; and
a control circuit configured to receive an output of the comparator circuit and responsively adjust the control input in response to a control signal that couples the control circuit to the voltage reference circuit on a single IC under test such that the voltage reference circuit provides a second reference voltage different from the first reference and closer to the voltage at the interface of the IC.

20. The IC of claim 19, wherein the comparator circuit is configured to compare the second reference voltage provided by the reference circuit to the voltage at the interface of the IC.

21. The IC of claim 19, wherein the control circuit is configured to output a data signal that identifies the magnitude of the voltage at the interface of the IC, the data signal responsive to the comparator circuit.

22. The IC of claim 19, wherein the comparator circuit comprises a latch that receives a clock signal having a frequency that enables the IC to track analog voltage signals.

23. The IC of claim 19, wherein the voltage reference circuit is responsive to a multiple bit control signal.

24. The IC of claim 19, wherein the voltage reference circuit generates an analog reference voltage.

25. A system, comprising:
a means for applying a control signal responsive to a first voltage;
an integrated circuit based means for comparing the first voltage with a voltage at an interface of an integrated circuit (IC) configured to identify when the first voltage is not substantially equal to the voltage at the interface of the IC; and
an integrated circuit based means for generating a second voltage responsive to the means for comparing, wherein the second voltage is greater than the first voltage when the first voltage is less than the voltage at the interface of the IC and wherein the second voltage is less than the first voltage when the first voltage is greater than the voltage at the interface of the IC such that the second voltage is closer in magnitude to the voltage at the interface of the IC than the first voltage is to the voltage at the interface of the IC, wherein said means for applying, said means for comparing, and said means for generating are coupled to core logic on a single IC die.

26. The system of claim 25, wherein the means for applying is responsive to at least one of an IC manufacturing process, a supply voltage, and an operating temperature.

27. The system of claim 25, wherein the means for generating is responsive to test logic enabled in a test access port.

28. The system of claim 25, wherein the means for applying, comparing, and generating are controllably applied to monitor voltage at the interface in real time.

* * * * *